United States Patent
Baldwin et al.

(10) Patent No.: US 6,419,802 B1
(45) Date of Patent: Jul. 16, 2002

(54) SYSTEM AND METHOD FOR CONTROLLING DEPOSITION THICKNESS BY SYNCHRONOUSLY VARYING A SPUTTERING RATE OF A TARGET WITH RESPECT TO A POSITION OF A ROTATING SUBSTRATE

(76) Inventors: David Alan Baldwin, 4803 Autumn Lake Way, Annadale, VA (US) 22003; Todd Lanier Hylton, 705 Crown Meadow Dr., Great Falls, VA (US) 22066

( * ) Notice: Subject to any disclaimer, the term of this patent is extended or adjusted under 35 U.S.C. 154(b) by 0 days.

(21) Appl. No.: 09/810,720

(22) Filed: Mar. 16, 2001

(51) Int. Cl.$^7$ .................. C23C 14/34; C23C 16/00; B05C 11/00
(52) U.S. Cl. ................ 204/192.13; 204/298.03; 204/298.08; 204/298.28; 427/9; 427/255.5; 118/712; 118/665; 118/669; 118/715; 118/730
(58) Field of Search .............. 204/298.03, 298.08, 204/298.28, 192.13; 118/712, 665, 669, 715, 730; 427/9, 255.5

(56) References Cited

U.S. PATENT DOCUMENTS

| | | | |
|---|---|---|---|
| 5,126,028 A | 6/1992 | Hurwitt et al. | 204/192.13 |
| 5,223,109 A | 6/1993 | Itoh et al. | 204/192.34 |
| 5,942,089 A | 8/1999 | Sproul et al. | 204/192.13 |
| 6,197,164 B1 * | 3/2001 | Pinarbasi | 204/192.11 |

* cited by examiner

Primary Examiner—Steven H. VerSteeg
(74) Attorney, Agent, or Firm—Morgan, Lewis & Bockius LLP (57) ABSTRACT

A system and method for controlling a circumferential deposition thickness distribution on a substrate includes a motor that rotates the substrate and a position sensor that senses a position of the substrate. At least one deposition thickness sensor senses the deposition thickness of the substrate at multiple positions on a circumference of a circle centered about an axis of rotation of the substrate. At least one controller drives a vapor source used to emit material for a deposition on a substrate. The at least one controller is coupled to the position sensor and the deposition thickness sensor. The controller synchronously varies an emission rate of material from the vapor source with respect to the position of the substrate to control the circumferential deposition thickness distribution.

13 Claims, 9 Drawing Sheets

SYSTEM AND METHOD FOR CONTROLLING DEPOSITION THICKNESS BY SYNCHRONOUSLY VARYING A SPUTTERING RATE OF A TARGET WITH RESPECT TO A POSITION OF A ROTATING SUBSTRATE

FIELD OF INVENTION

The present invention is directed generally to novel systems and methods for performing sputter deposition, and to optical devices manufactured using such systems and methods.

BACKGROUND OF THE INVENTION

It is believed that in vapor deposition systems such as ion beam sputtering, magnetron sputtering, diode sputtering, thermal evaporation, electron beam evaporation, pulsed laser vaporization and cathodic arc vaporization, atoms or molecules ejected from a target are directed toward a substrate disposed on a wafer where they condense to form a film. In most cases, the deposited film shows variation in thickness across the wafer that the user would like to eliminate (for uniform deposition) or control (thickness gradient) to meet the needs of a particular application. It would be beneficial to provide a system that improves control of the deposition thickness on a wafer.

SUMMARY OF THE INVENTION

The present invention is directed to a system and method for controlling a circumferential deposition thickness distribution on a substrate. A motor rotates the substrate and a position sensor senses a rotary position of the substrate. At least one deposition thickness sensor senses the deposition thickness of the film on the substrate at multiple positions on a circumference of a circle centered about an axis of rotation of the substrate. At least one controller drives a vapor source used to emit material for deposition on the substrate. The controller is coupled to the positioning sensor and the deposition thickness sensor. The controller synchronously varies an emission rate of the material from the vapor source with respect to the rotary position of the substrate to control the circumferential deposition thickness distribution.

In accordance with a further aspect, the present invention is directed to a system and method for controlling a circumferential deposition thickness distribution on a substrate. A motor rotates the substrate and a positioning sensor senses a rotary position of the substrate. At least one deposition thickness sensor senses the deposition thickness of the film on the substrate at multiple positions on a circumference of a circle centered about an axis of rotation of the substrate. A target power supply drives a target used to sputter material on the substrate. A process controller is coupled to the positioning sensor, the deposition thickness sensor, and the target power supply. The process controller synchronously varies a sputtering rate of the target with respect to the rotary position of the substrate to control the circumferential deposition thickness distribution.

The invention also includes an optical filter created using the disclosed system and method.

BRIEF DESCRIPTION OF THE DRAWINGS

The accompanying drawings, which are incorporated herein and constitute part of this specification, illustrate presently preferred embodiments of the invention, and, together with the general description given above and the detailed description given below, serve to explain features of the invention. In the Drawings.

DETAILED DESCRIPTION OF THE PREFERRED EMBODIMENTS

Figure 1A:
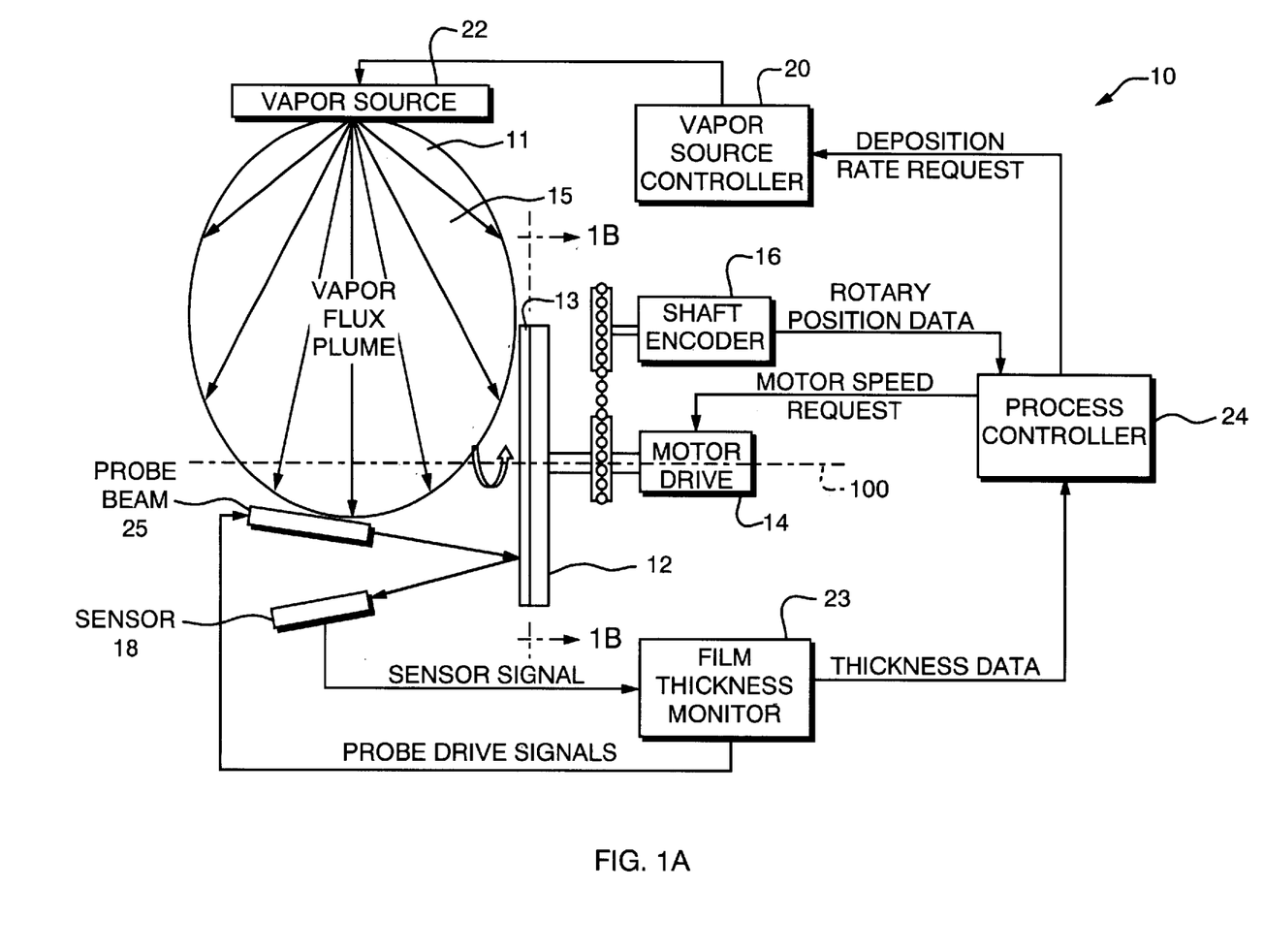
FIG. 1A is a schematic diagram of the system for performing vapor deposition using circumferential thickness control according to the present invention.
Figure 1B:
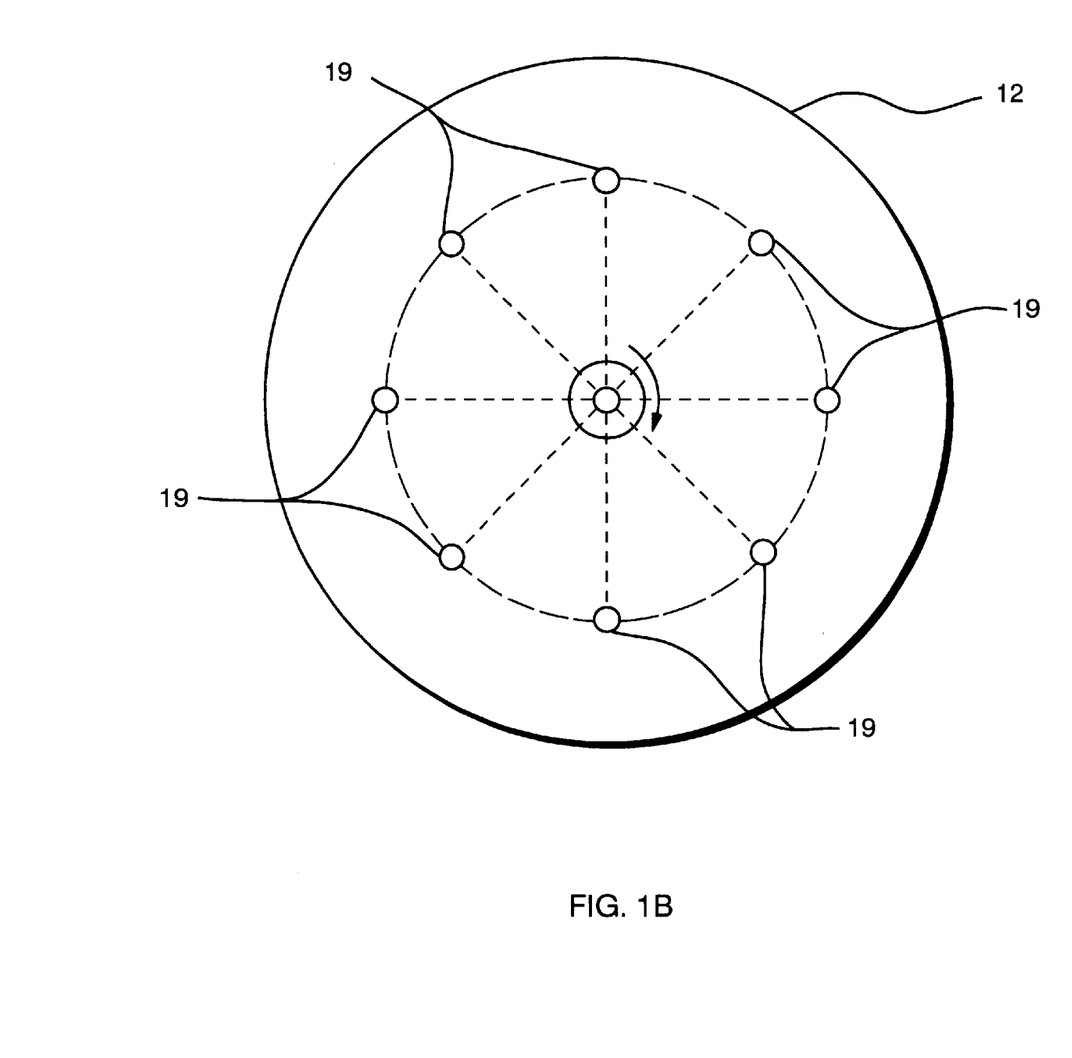
FIG. 1B is a diagram of a substrate showing the sensing of deposition thickness at multiple positions on the circumference of a substrate, wherein the circumference corresponds to a circle centered about an axis of rotation of the substrate, according to the present invention.
Figure 5:
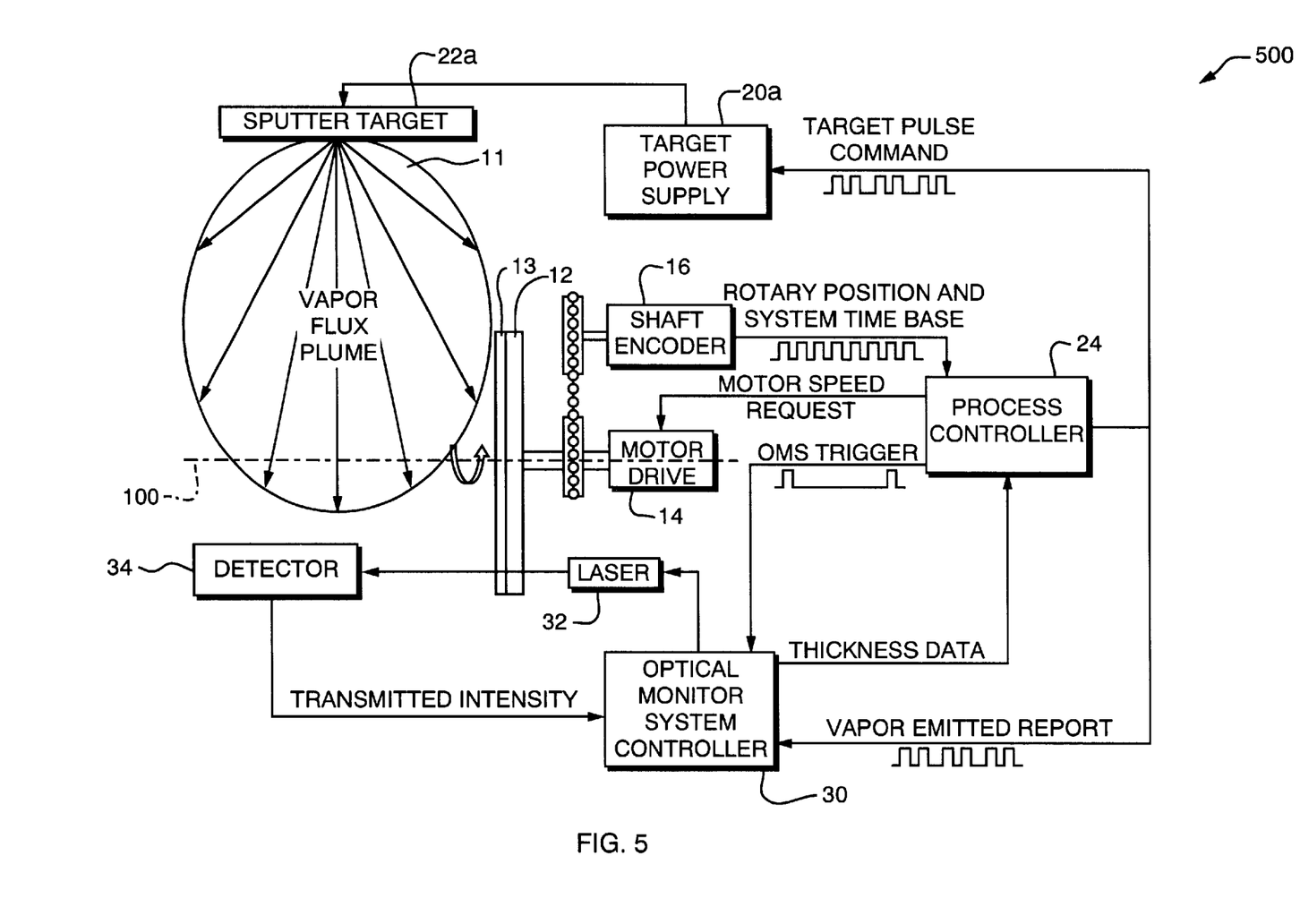
FIG. 5 is a schematic diagram of an alternate embodiment of the system for performing sputter deposition using a pulse control scheme, a target power supply and an optical monitor system controller according to the present invention.

There is shown in FIG. 1A, a system 10 for controlling a circumferential deposition thickness distribution on a substrate 12. A motor 14 rotates the substrate 12 about axis 100, and a positioning sensor 16, generally a rotary shaft encoder, senses a rotary position of the substrate 12 during rotation of the substrate. At least one deposition thickness sensor 18 senses the deposition thickness of film material 13 deposited on the substrate 12 at multiple positions 19 (shown in FIG. 1B) on a circumference of a circle centered about an axis 100 of rotation the substrate 12. Although in the embodiment shown, substrate 12 is circular in shape, it will be understood that a substrate 12 that was square or some other shape could also be used with the present invention. A vapor source controller 20 drives a vapor source 22. The vapor source 22 creates a vapor flux plume 11 that is disposed proximate the substrate 12. The vapor flux plume 11 contains material 15 for deposition on the substrate 12 as deposited film material 13. The vapor source may be created by a target (as shown in FIG. 5) that is sputtered with high energy ions, a solid charge that evaporates as it is heated, or a chemical vapor deposition source. A process controller 24 is coupled to the motor 14, the shaft encoder 16, the deposition thickness sensor 18, and the vapor source controller 20. In another embodiment shown in FIG. 5, the vapor source controller 20 and the vapor source 22 may be a target power supply 20a that drives a target 22a that is used to sputter material 15 on the substrate 12.

In the embodiment of FIG. 1, the process controller 24 is coupled to a film thickness monitor 23. It should be recognized by those skilled in the art that the functions of the process controller 24 and film thickness monitor 23 may be combined into a single controller. The film thickness monitor 23 is further coupled to one or more deposition thickness sensors 18 (only one of which is shown in FIG. 1) and one or more probe beams sources 25 (only one of which is shown in FIG. 1), each of which corresponds to one of the deposition thickness sensors 18. Probe drive signals are fed into each probe beam source 25 by the film thickness monitor 23. Beams generated by each probe beam source 25 are reflected or scattered from the substrate and then sensed by a corresponding one of the deposition thickness sensors 18. Sensor signals (having values related to the deposition thickness on the substrate or the thickness of the substrate in combination with any deposited material) from each deposition thickness sensor 18 are fed into the film thickness monitor 23. Thickness data from the film thickness monitor 23 is then fed into the process controller 24 in order to monitor the deposition thickness of material 13 on the substrate. In one embodiment, the process controller 24 associates the thickness data provided by film thickness monitor 23 with rotary positioning data from the shaft encoder 16 in order to map the deposition thickness data to spatial positions on a circumference of substrate 12 during operation of system 10.

In one embodiment, each probe beam source 25 generates a probe beam that strikes multiple positions 19 on a circumference of a circle centered about axis 100 as substrate 12 rotates. This is accomplished, for example, by aiming the probe beam source at a fixed position in space corresponding to a fixed distance from axis 100, and then generating a probe beam targeted at the fixed position periodically as the substrate 12 rotates. By generating the probe beam targeted at the fixed position two or more times during each rotation of the substrate, the present invention is able to sense the deposition thickness of material 13 at multiple positions 19 on a circumference of a circle centered about axis 100 during rotation of the substrate. It will be understood by those skilled in the art that, by using multiple probe beam sources 25 such as the one described above, wherein each of the probe beam sources 25 generates a probe beam targeted at a different fixed position that is at a different distance from axis 100, the present invention is able to sense the deposition thickness of material 13 at multiple positions on the circumference of a plurality of different circles (each having a different radius from axis 100) during rotation of the substrate 12. Rotary position data from shaft encoder 16 is fed into the process controller 24 and associated with each deposition thickness measurement.

In response to the mapped deposition thickness data derived from the signals from thickness monitor 23 and shaft encoder 16, process controller 24 varies the deposition rate of the emitted material 15 from the vapor source 22 synchronously in accordance with the rotary position of the substrate 12. As shown in FIG. 1, vapor flux plume 11, with its depositable material 15, is divergent and is not aimed in an axi-symmetric fashion at substrate 12. Such flux may be formed, for example, by directing an ion current at a given position on a planar target that is not coaxial with the substrate. As a result, as seen in FIG. 1A, the deposition rate of material 15 onto film material 13 on substrate 12 will be higher for portions of the substrate that are closer to the vapor source 22, and lower for portions of substrate 12 positioned farther away from vapor source 22. As a result of this geometry, process controller 24 is able to increase/decrease the deposition rate of material 13 along any given circumferential (or azimuthal) section of substrate 12 by simply slowing down/speeding up the rotation rate of substrate 12 as the given circumferential (or azimuthal) section passes closest to vapor source 22 during rotation of the substrate. Alternatively, in cases where a constant rotation rate is desired, process controller 24 can vary the deposition rate of material 13 at any given circumferential section of substrate 12 by increasing/decreasing the rate of material emitted from source 22 as the given circumferential section passes closest to vapor source 22. It will be understood by those skilled in the art that the deposition rate at any given circumferential section of substrate 22 can therefore be varied by either adjusting the rate of emissions from source 22, the speed of rotation of substrate 12, or combination thereof, as the given circumferential section passes closest to vapor source 22 during each of its rotations.

Figure 2:
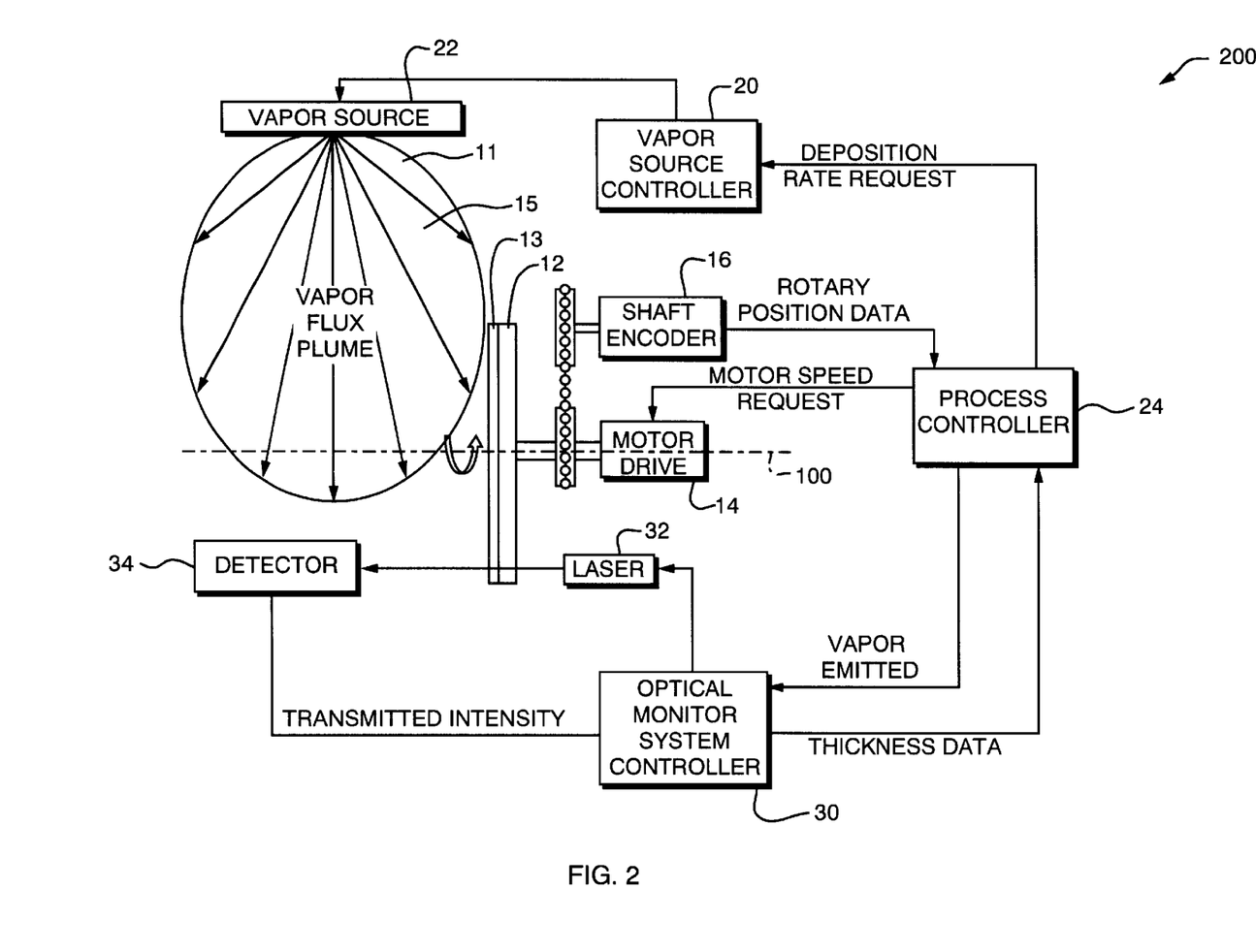
FIG. 2 is a schematic diagram of an alternate embodiment of the system for performing vapor deposition using circumferential thickness control according to the present invention.

A second embodiment of a system 200 for controlling a deposition thickness on a substrate 12 is shown in FIG. 2. The system 200 is identical to system 10 as described in FIG. 1A, with the exception that the process controller 24 is coupled to an optical monitoring system controller 30. One or more lasers 32 (only one of which is shown in FIG. 2) are driven by the optical monitoring system 30. One or more detectors, 34 (only one of which is shown in FIG. 2) sense the output of each laser 32 after passage of an output beam through substrate 12. Each detector 34 feeds a sensor signal into the optical monitoring system controller 30 in order to monitor the deposition thickness of material 13 on the substrate, in a manner substantially analogous to the system shown in FIG. 1. However, in the system of FIG. 2, the process controller 24 also provides a vapor-emitted signal that represents the quantity of deposited material on the substrate 12 to controller 30. The vapor emitted signal is a time varying signal that represents the magnitude of material emitted from vapor source 22 during each of a plurality of time segments in which system 200 is operating. In the embodiment discussed below in FIGS. 3–4, the vapor-emitted signal represents a count of a number of pulses provided to the vapor source controller 20 in order to drive vapor source 22. The sum of pulses in the vapor emitted signal over a given time provides a parameter that is proportional to the thickness of the material 15 deposited as film 13 on the substrate 12 over the given time. A constant exists between the number of pulses provided to vapor source controller 20 over a given time and the total thickness of material deposited on the substrate during the given time. The constant (which corresponds to the thickness of material deposited on the substrate for each pulse provided to the vapor source controller) is determined by dividing the thickness value provided by the sensor signal at the end of the given time by the total number of pulses in the vapor emitted signal during the given time. Controller 24 uses this proportionality constant to predict the number of pulses that need to be applied to the vapor source controller in order to reach a desired deposition thickness during operation of the device, thereby preventing the deposition thickness from exceeding the target thickness as a result of overshoot resulting from feedback control.

Figure 3:
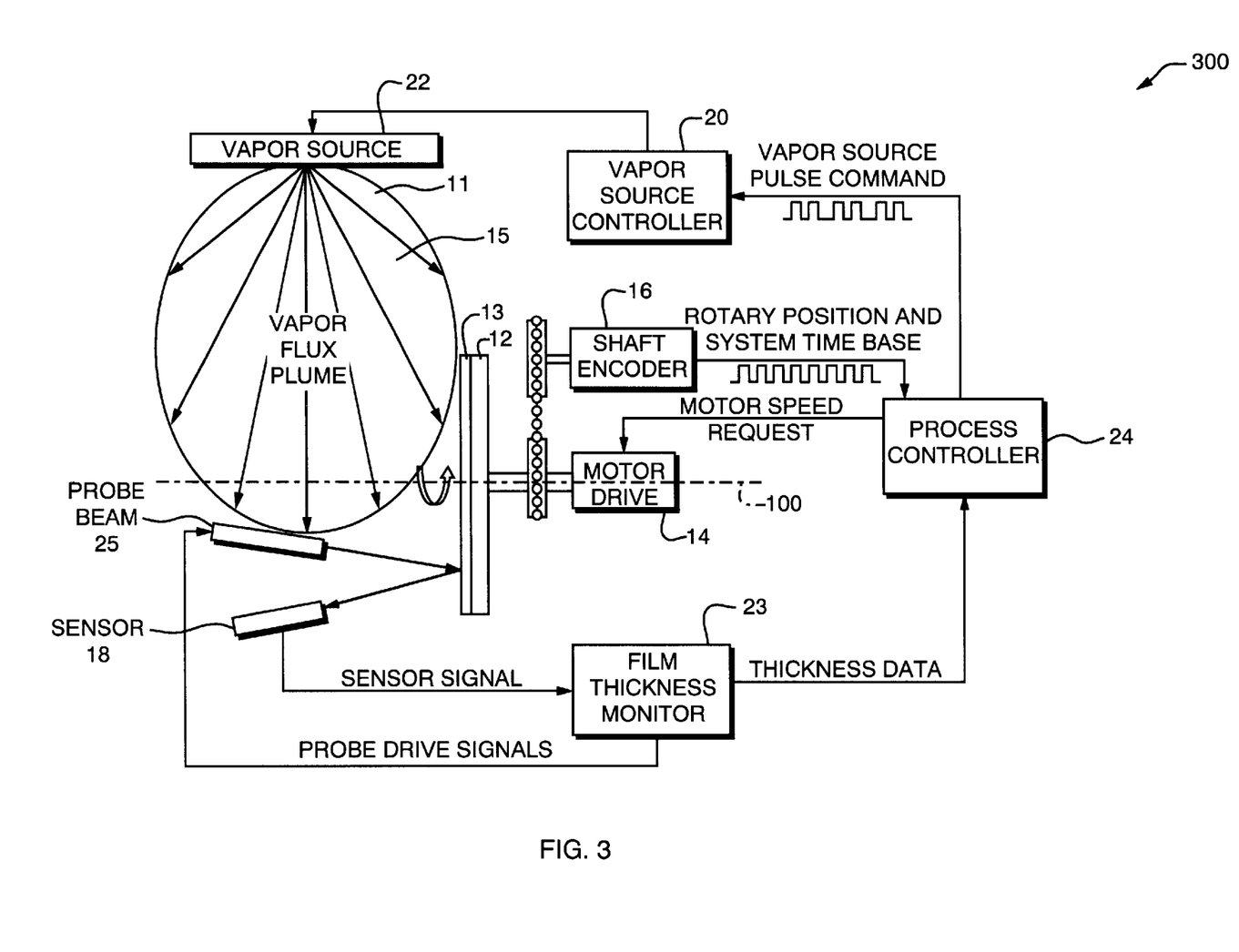
FIG. 3 is a schematic diagram of the system for performing vapor deposition using a pulse control scheme and a film thickness monitor according to the present invention.

A third embodiment of a system 300 for controlling a deposition thickness on a substrate 12 is shown in FIG. 3. The system 300 is substantially identical to system 10 as described in the first embodiment. In the system of FIG. 3, a rotary position/system time base signal (e.g., a pulse train output) is generated by the shaft encoder 16. The process controller 24 uses the thickness data (described above in connection with FIG. 1) and the pulse train output to vary the emission rate of material vapor source 22. In this embodiment, the pulse train output of the shaft encoder 16 is modified by the process controller 24 to generate the signal used to vary the emission rate of the vapor source. In particular, the process controller 24 in essence uses the pulse train from the shaft encoder 16 as the default signal for driving vapor source controller 20, but the process controller omits pulses from the pulse train sent to the vapor source controller in order to vary the emission rate from vapor source 22. Since, in this embodiment, the emission rate of material from vapor source 22 is directly proportional to the number of pulses received by vapor source controller 20 during a given time segment, the omission of pulses from the signal provided to the vapor source controller during any given time segment will serve to decrease the emission rate of material 15 from the vapor source during such time segment. It should be recognized by those skilled in the art that the process controller 24 may vary the emission rate of the vapor source 22 by varying a duty cycle, an amplitude, a frequency or any combination thereof, of the pulse train signal provided to vapor source controller 20.

Figure 4:
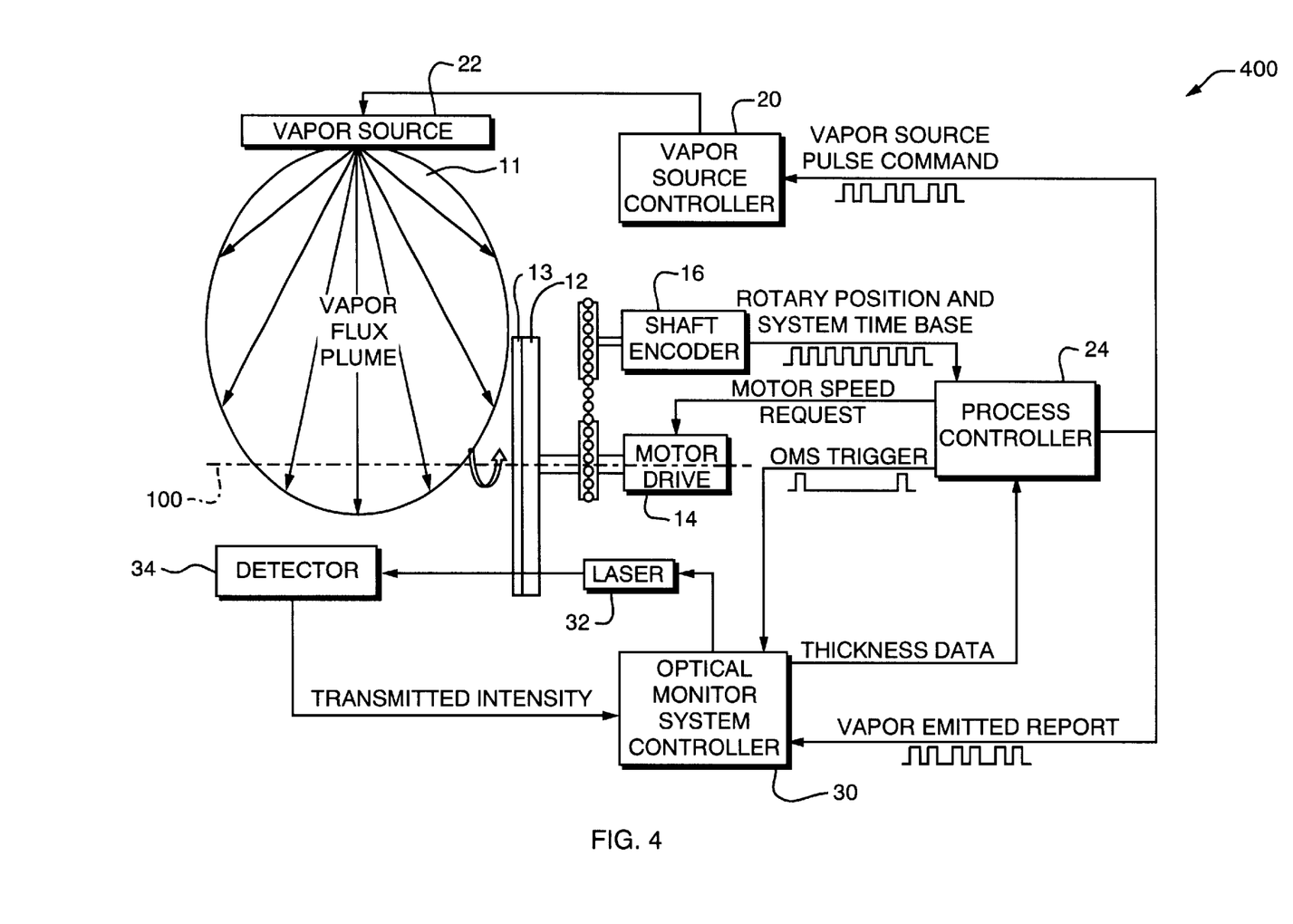
FIG. 4 is a schematic diagram of an alternate embodiment of the system for performing vapor deposition using a pulse control scheme and an optical monitor system controller according to the present invention.

A fourth embodiment of a system 400 for controlling a deposition thickness on a substrate 12 is shown in FIG. 4. The system 400 is identical to system 300 as shown in FIG. 3, with the exception that the optical monitoring system controller 30, the laser 32, and the detector 34 as shown in FIG. 2 and as described in the second embodiment are employed. In addition, an optical monitor system trigger signal (OMS trigger) is fed from the process controller 24 to the optical monitor system controller 30. The OMS triggers measurements by each laser 32 at multiple points (e.g., positions 19) along a single circumference of the substrate 12 during rotation of the substrate. A further variation to this embodiment shows a coupling of the vapor source command pulse train signal to optical monitoring system 30. Since the vapor source command pulse train signal is proportional to the quantity of material emitted from vapor source 20 during any given time segment, the vapor source command pulse train signal may be used (as described above in FIG. 2) to generate the thickness data supplied to process controller 24.

A fifth embodiment of a system 500 for controlling a deposition thickness on a substrate 12 is shown in FIG. 5. The system 500 is identical to system 400 as shown in FIG. 4, with the exception that a target 20*a* and a target power supply 22*a* are used in place of the more generic vapor source 20 and vapor source controller 22 shown previously.

Figure 6:
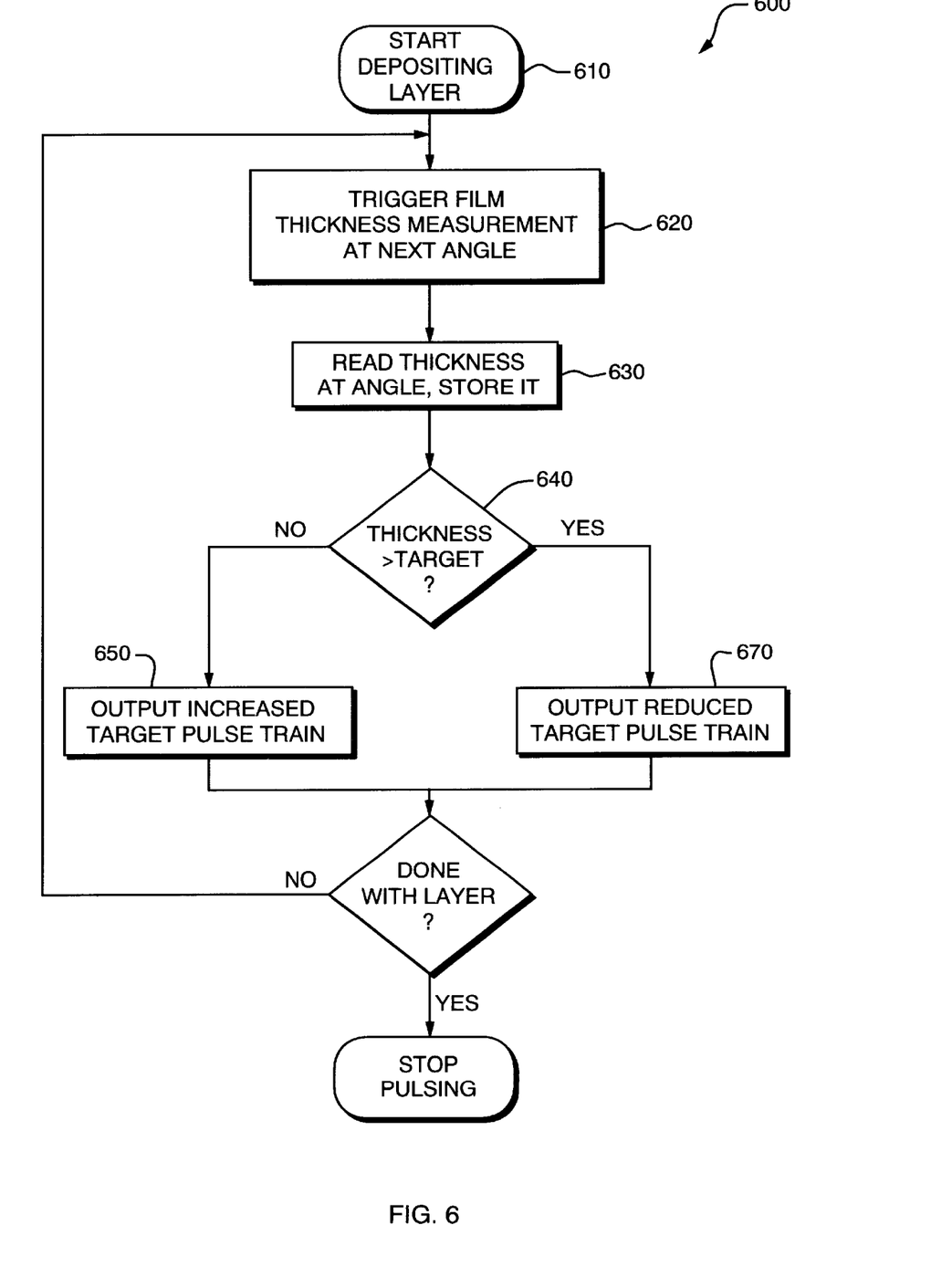
FIG. 6 is a flow diagram showing the steps of monitoring and controlling the pulse train output of the position sensor by the process controller to control the deposition thickness of the substrate according to the present invention.

Referring now to FIG. 6, there is shown a flow diagram detailing the steps of a method 600 for monitoring film thickness and controlling the pulse train output of the position sensor 16 by the process controller 24 to control the deposition thickness on the substrate. In step 610, a layer of material 13 is deposited in an ongoing deposition on the substrate 12 during rotation of the substrate. As the substrate 12 rotates to a trigger angle in step 620, the thickness at that angle is read and then stored in the memory of the process controller (step 630). If the stored thickness is less(or greater) than a predetermined desired thickness (step 640), then the pulse train output to vapor source controller 22 is modified such that the vapor emission rate increases in step 650 (or decreases in step 670) when the circumferential portion of the substrate corresponding to the film thickness measurement is in position close to the vapor source (or target). Once the predetermined thickness of the layer is reached, then pulsing is stopped.

Figure 7:
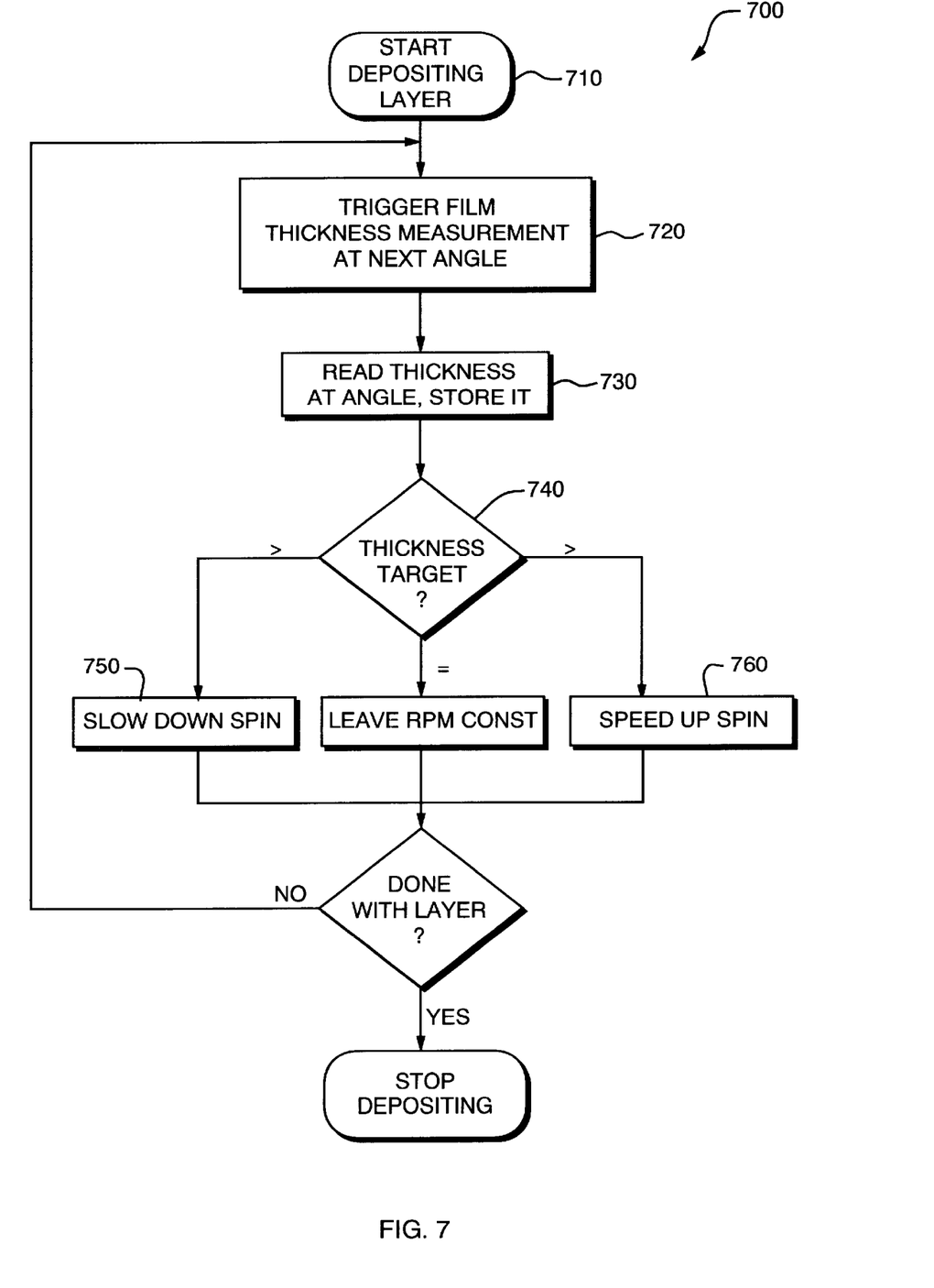
FIG. 7 is a flow diagram showing the steps of monitoring and controlling the RPM of the motor drive of the substrate by the process controller to control the deposition thickness of the substrate according to the present invention.

Referring now to FIG. 7, there is shown a flow diagram detailing the steps of a method 700 for monitoring and controlling the RPM of motor drive 14 by process controller 24 to control the deposition thickness of material 13 on the substrate according to the present invention. In step 710, a layer of material is deposited in an ongoing deposition on the substrate 12 during rotation of the substrate. As the substrate 12 rotates to a trigger angle in step 720, the thickness at that angle is read and then stored in the memory of the process controller (step 730). The process controller compares the stored thickness with a predetermined desired thickness in step 740. If the stored thickness is less (or greater) than a predetermined desired thickness, then the substrate rotation speed is modified such that the rotation speed decreases in step 750 (or increases in step 760) when the circumferential portion of the substrate corresponding to the film thickness measurement is in position close to the vapor source (or target). The process is repeated until processing of a given layer of material 13 is complete.

A method for controlling a deposition thickness on a substrate 12 using the system shown in FIG. 1, will now be described. The method comprises the steps of rotating a substrate 12 with a motor 14 and sensing an angular position of the substrate 12 with a shaft encoder 16. At least one deposition sensor 18 senses the deposition thickness of the film 13 on substrate 12 at multiple positions on a circumference of a circle centered about the axis 100 of rotation of the substrate. At least one process controller 24 drives a vapor source 22 used to emit material 15 for deposition on the substrate 12. The process controller 24 is coupled to the motor 14, the shaft encoder 16, the vapor source controller 20, and the deposition thickness sensor 18. The process controller 24 synchronously varies the vapor flux rate of the emitted material 15 with respect to the angular position of the substrate 12 to control the deposition thickness of film 13 around a circumference of the substrate.

Figure 8A:
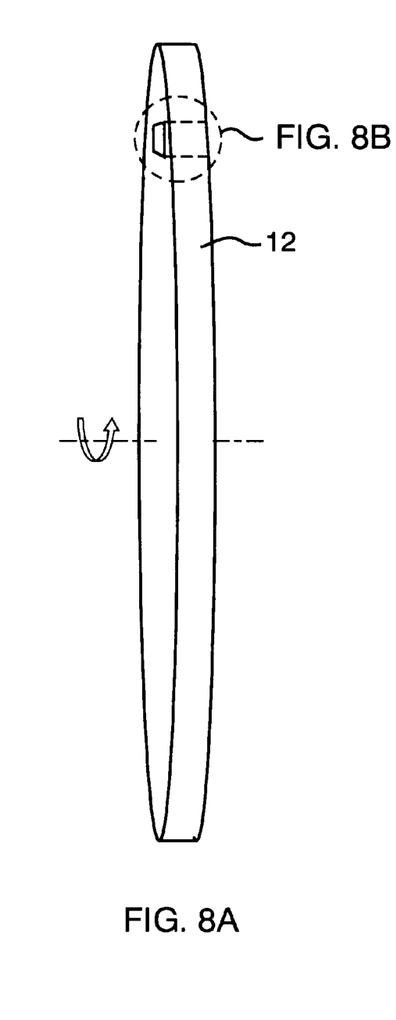
FIGS. 8A and 8B depict an optical filter formed using the systems and methods of the present invention.
Figure 8B:
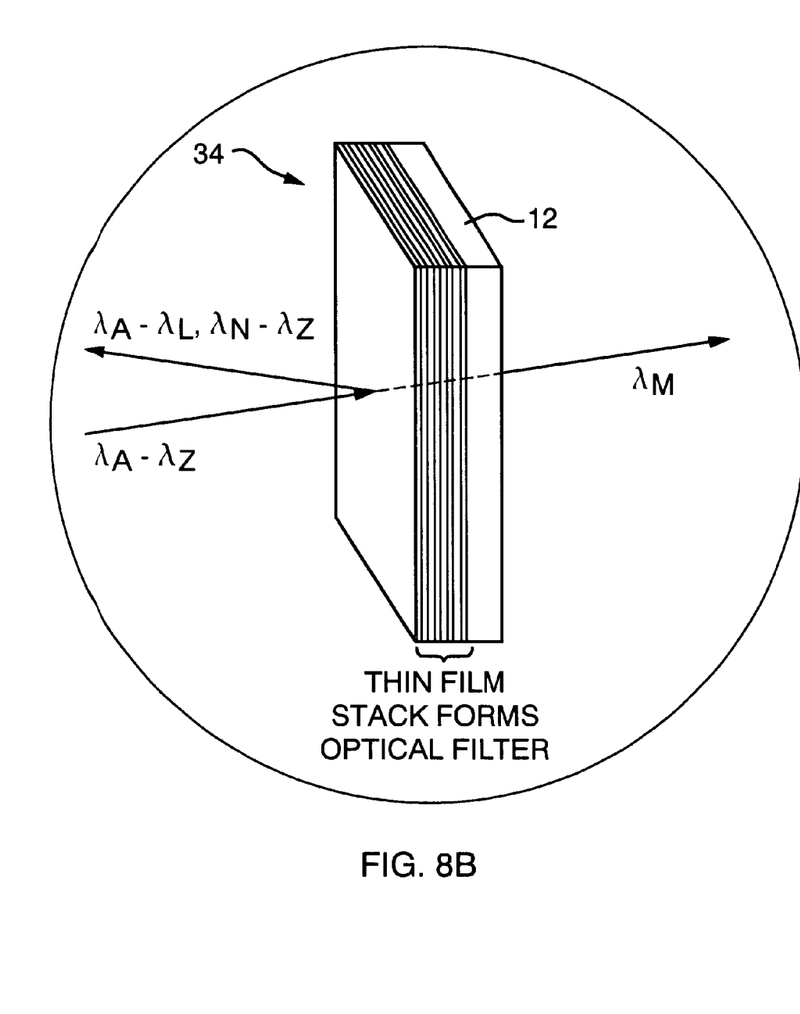

The system and process described above may be advantageously used to create an optical filter 35, as shown in FIGS. 8A, 8B when light including $\lambda_A \lambda_Z$ is directed at filter 35, $\lambda_A$–$\lambda_L$ and $\lambda_N$ $\lambda_Z$ is reflected and $\lambda_M$ passes through the filter. When the pesent invention is used to form an optical filter 35, the substrate 12 is preferably formed of a glass wafter, the material deposited on the substrate is alternating layers of tantalum oxide and silicon oxide, and the thickness of the material deposited on the substrate is low-order multiples and/or fractions of the optical thickness at the wavelenth of light that the filter will serve to isolate. The filter 35 may be used in the form deposited or it may be further processed by sawing, grinding, trimming, back-thinning, polishing, mounting, bonding or other means to incorporate the filter into an optic assembly. It will be evident to practioners of the art that substrates other than glass may be used, that smaller substtrate pieces may be attactched to the wafer 12 for deposition of the filters on the smaller pieces, that deposited materials other than tantalum oxide and silicon oxide could be used for the filter, as long as the refractive index contrast was sufficiently large, and that a variety of differing optical stack designs might be employed to create a filter.

It will be appreciated by those skilled in the art that changes could be made to the embodiments described above without departing from the broad inventive concept thereof. For example, although several individual controllers are shown in various embodiments, it will be understood that the functions of such multiple controllers could be performed by a single controller. It is understood, therefore, that this invention is not limited to the particular embodiments disclosed, but is intended to cover modifications within the spirit and scope of the present invention as defined in the appended claims.

What is claimed is:

1. A system for controlling a circumferential deposition thickness distribution on a substrate comprising:

(a) a motor that rotates the substrate;

(b) a position sensor that senses a rotary position of the substrate;

(c) at least one deposition thickness sensor that senses the deposition thickness of the substrate at multiple positions on a circumference of a circle centered about an axis of rotation of the substrate;

(d) a target power supply that drives a target used to sputter material on the substrate;

(e) a process controller coupled to the position sensor, the at least one deposition thickness sensor, and the target power supply; and (f) wherein the process controller synchronously varies a sputtering rate of the target with respect to the rotary position of the substrate to control the circumferential deposition thickness distribution.

2. The system of claim 1, wherein the at least one deposition thickness sensor is an optical sensor.

3. The system of claim 1, wherein the deposition thickness is determined by the process controller in response to an output of the at least one deposition thickness sensor and a target bias signal that is proportional to the sputtering rate.

4. The system of claim 1, wherein the process controller varies the sputtering rate by varying a target bias signal.

5. The system of claim 4, wherein the process controller modifies a pulse train output by the position sensor to generate the target bias signal which changes a deposition rate on the substrate when a portion of the rotating substrate proximate the target has a deposition thickness that requires modification to match a desired deposition thickness.

6. The system of claim 5, wherein the pulse train output by the position sensor is modified by the process controller to generate the target bias signal by adding or omitting pulses from the target bias signal.

7. The system of claim 1, wherein the process controller varies the sputtering rate by varying a duty cycle of a target bias signal.

8. The system of claim 1, wherein the process controller varies the sputtering rate by varying an amplitude of a target bias signal.

9. The system of claim 1, wherein the process controller varies the sputtering rate by varying a frequency of a target bias signal.

10. A method for controlling a circumferential deposition thickness distribution on a substrate, the method comprising the steps of:

(a) rotating the substrate with a motor;

(b) sensing a rotary position of the substrate with a position sensor;

(c) sensing the deposition thickness of the substrate at multiple positions on a circumference of a circle centered about an axis of rotation of the substrate with at least one deposition thickness sensor; and (d) synchronously varying a sputtering rate of a target with respect to the rotary position of the substrate, in response to outputs of the position sensor and the at least one deposition thickness sensor, to control the circumferential deposition thickness distribution on the substrate.

11. A system for controlling a circumferential deposition thickness distribution on a substrate comprising:

(a) a motor that rotates the substrate;

(b) a position sensor that senses a rotary position of the substrate;

(c) at least one deposition thickness sensor that senses the deposition thickness of the substrate at multiple positions on a circumference of a circle centered about an axis of rotation of the substrate;

(d) at least one source controller that drives a vapor source used to emit material for deposition on the substrate, said at least one source controller being coupled to the position sensor and the at least one deposition thickness sensor; and (e) wherein the at least one source controller synchronously varies an emission rate of material from the vapor source with respect to the rotary position of the substrate to control the circumferential deposition thickness distribution.

12. The system of claim 11, wherein the at least one source controller comprises a vapor source controller that drives the vapor source, and a process controller coupled to the vapor source controller, the position sensor and the at least one deposition thickness sensor, wherein the process controller synchronously varies the emission rate of material from the vapor source with respect to the rotary position of the substrate to control the circumferential deposition thickness distribution.

13. A method for controlling a circumferential deposition thickness distribution on a substrate comprising:

(a) rotating a substrate with a motor;

(b) sensing a rotary position of the substrate with a position sensor;

(c) sensing the deposition thickness of the substrate at multiple positions on a circumference of a circle centered about an axis of rotation of the substrate with at least one deposition thickness sensor; and (d) synchronously varying an emission rate of material from a vapor source with respect to the rotary position of the substrate, in response to outputs of the position sensor and the at least one deposition thickness sensor, to control the circumferential deposition thickness distribution.

* * * * *